United States Patent [19]

Shiobara et al.

[11] Patent Number: 4,851,766
[45] Date of Patent: Jul. 25, 1989

[54] FAULT DIAGNOSIS SYSTEM FOR ROTOR WINDING OF ROTARY ELECTRIC MACHINE

[75] Inventors: Ryoichi Shiobara, Hitachi; Masao Ohi, Mito, both of Japan

[73] Assignee: Hitachi, Ltd., Tokyo, Japan

[21] Appl. No.: 130,477

[22] Filed: Dec. 9, 1987

[30] Foreign Application Priority Data

Dec. 15, 1986 [JP] Japan ................................. 61-296723

[51] Int. Cl.⁴ ........................ G01R 31/02; H02P 8/00; H02K 11/00
[52] U.S. Cl. ............................ 324/158 MG; 324/546; 324/547; 324/55; 318/490; 318/696; 322/99
[58] Field of Search ................... 324/158 MG, 55, 62, 324/430, 546, 547; 340/648; 318/490, 696; 363/71; 322/99

[56] References Cited

U.S. PATENT DOCUMENTS

| | | | |
|---|---|---|---|
| 3,783,382 | 1/1974 | Reynolds | 324/62 X |
| 3,967,199 | 6/1976 | Knoop et al. | 324/158 MG X |
| 4,020,416 | 4/1977 | Ottos | 324/62 X |
| 4,222,005 | 9/1980 | Naito | 324/158 MG X |
| 4,377,784 | 3/1983 | Saito et al. | 324/158 MG X |
| 4,528,556 | 7/1985 | Maddox | 340/648 X |
| 4,678,998 | 7/1987 | Muramatsu | 324/430 X |
| 4,731,720 | 3/1988 | Takahashi | 363/71 X |

FOREIGN PATENT DOCUMENTS

| | | |
|---|---|---|
| 87118560 | 4/1988 | European Pat. Off. . |
| 0592728 | 1/1934 | Fed. Rep. of Germany . |
| 1613879 | 9/1967 | Fed. Rep. of Germany ........ 324/55 |
| 58-12555 | 1/1983 | Japan . |
| 8606497 | 11/1986 | World Int. Prop. O. ............ 324/55 |

Primary Examiner—Reinhard J. Eisenzopf
Assistant Examiner—Vinh P. Nguyen
Attorney, Agent, or Firm—Antonelli, Terry & Wands

[57] ABSTRACT

A fault diagnosis system for a rotor winding of rotary electric machines is disclosed, in which the rotor winding of rotary field type is excited in DC fashion by an excitation circuit, on which an AC voltage is superposed, the impedance of the rotor winding is calculated from the current and voltage of the AC portion flowing in the rotor winding, and the resulting impedance is compared with a reference impedance thereby to decide a fault, if any, of the rotor winding, thus making possible accurate diagnosis of a rotary electric machine even while it is running.

6 Claims, 2 Drawing Sheets

FAULT DIAGNOSIS SYSTEM FOR ROTOR WINDING OF ROTARY ELECTRIC MACHINE

BACKGROUND OF THE INVENTION

The present invention relates to a fault diagnosis system for a rotor winding of a rotary electric machine such as a large-capacity turbine generator, or more in particular to a rotor winding fault diagnosis system suitable for detecting inter-layer shorting of the rotor winding.

Conventional rotor winding fault diagnosis systems of this type generally used in the past, as one of such examples is disclosed in U.S. Pat. No. 4,377,784 or JP-A-58-12555, comprises a magnetic flux detector for detecting the magnetic fluxes generated in proximity of the surface of the rotor thereby to determine whether the rotor winding is in fault or not In these conventional rotor winding fault diagnosis systems, however, a magnetic flux detector is required to be projected into the rotary machine for continuous monitor, and therefore the problem during rotation or heating under high magnetic field is posed, resulting in a low reliability in over long-time operation. In cases other than continuous operation, the magnetic flux detector is inserted into the rotary electric machine while the rotor is rotating, thus giving rise to a danger of contact between the rotor and the magnetic flux detector. Further, in a rotary electric machine of hydrogen-cooling type so constructed that a magnetic flux detector is inserted from outside the machine, the insert ion work is difficult as hydrogen is sealed inside.

In order to solve these problems, rotor winding fault diagnosis system as shown in FIG. 2 has been suggested by one of the inventors of the present invention and another. As shown in FIG. 2, a field winding 1 is supplied with a field current from excitation means 2, and the system further comprises a field current detector 3 and a field voltage detector 4. The field current I detected at the field current detector 3 and the field voltage V detected at the field voltage detector 4 are used to calculate the field resistance $R_t = V/I$ at a given time point t by an arithmetic unit 5. This field resistance $R_t$ is stored in a memory, while a field resistance $R_t$-$\Delta t$ stored a predetermined time $\Delta t$ before the ti-e point t is produced from a memory 6, and is compared with the field resistance $R_t$. If the absolute value if the difference between them is larger than a predetermined value $\Delta R$, a signal is produced as an alarm from a comparator 7. The alarm signal thus produced from the comparator 7 is displayed on a display unit 8.

In this configuration for comparing the field resistance $R_t$ at a given time point t with the field resistance $R_{t-\Delta t}$ at a time point t -$\Delta t$, if a fault such as an inter-layer shorting occurs in the field winding 1 during the time period $\Delta t$, the field resistance $R_{t-\Delta t} = 0.5$ ohm at a time point t 14 $\Delta t$ becomes $R_t = 0.4$ ohm at the time point t, for example. As a result, the absolute value of the difference between the field resistor $R_t$-$\Delta t$ and the field resistance $R_t$ becomes 0.1 ohm. Assume that the value $\Delta R$ is set to 0.05 ohm. Then, $$|R_t - (R_t - \Delta t)| > \Delta R \tag{1}$$

An alarm signal is thus produced from the comparator 7, and a fault is indicated on the display unit 8.

If the field winding 1 is disconnected, on the other hand, the field resistance $R_t$-$\Delta t$ at time point t -$\Delta t$ becomes $R_t = \infty \Omega$ at time point t. As a consequence, the absolute value of the difference between the two field resistances is $\infty \Omega$. Therefore, if the value $\Delta R$ is set at 0.05 ohm, $$|R_t - (R_t - \Delta t)| > R \tag{2}$$

The comparator 7 thus produces an alarm signal with a fault indicated on the display unit 8.

In this way, such a fault as an inner-layer shorting or disconnection of the rotor winding is detected by the field current detector 3 and the field voltage detector 4 installed outside of the rotary electric machine on the one hand, and if the value $\Delta R$ is set properly, it is possible to diagnose a fault of the rotor winding without being affected by the faulty operation due to noises or the change in field resistance due to temperature increase of the field winding on the other.

The above-described suggested rotor winding fault diagnosis systems in which a fault is detected by the winding resistance of the rotor winding, however, has the disadvantage that if an inter-layer shorting occurs in the rotor winding, for instance, the difference between the winding resistance before and after occurrence of the inter-layer shorting of the rotor winding is very much decreased to an undetectable extent in he case of a great number of turns of the rotor winding involved, so that applications of the diagnosis system are limited.

SUMMARY OF THE INVENTION

The object of the present invention is to provide a fault diagnosis system for a rotor winding of a rotary electric machine which is capable of detecting an inter-layer shorting of the rotor winding with high accuracy even during operation.

In order to achieve the abovementioned object, there is provided according to the present invention a fault diagnosis system comprising a power supply for superposing an AC voltage on the DC voltage of excitation means of the rotor winding, a field voltage detector for detecting an AC portion of the voltage of the rotor winding of an excitation circuit, a field current detector for detecting an AC portion of the current flowing in the rotor winding, an arithmetic unit for calculating the impedance of the rotor winding from the voltage and current detected from the field voltage detector and the field current detector respectively, and fault decision means for deciding a fault of the rotor winding from the value of the impedance. In this configuration, in the case where an AC voltage V is applied to the excitation circuit and an AC current I flows therein, the impedance $Z_0$ of the rotor winding is given as $$Z_0 = V/I \tag{3}$$

In the case of an inter-layer shorting of the rotor winding where a number $\Delta N$ of winding turns out of N are shorted and become ineffective, on the other hand, the impedance Z of the rotor winding is expressed as $$\begin{aligned} Z &= Z_0(1 - \Delta N/N) \\ &= Z_0 - \Delta Z_1 \end{aligned} \tag{4}$$

In view of the fact that an AC current is supplied by a power supply, however, there flows in the shorted number $\Delta N$ of turns of the winding such a current as to offset the magnetic fluxes generated in the sound number of turns of winding (N $-\Delta N$) by the electromagnetic induction. As a result, assuming that the reduction in impedance due to the electromagnetic induction is $\Delta Z_2$, the apparent impedance Z of the rotor winding is given as $$Z = Z_0 - \Delta Z_l - \Delta Z_2 \qquad (5)$$

It is seen from this equation that the imped is further increased by $\Delta Z_2$ as compared with when a DC current is supplied, thereby increasing the detection accuracy.

DESCRIPTION OF THE PREFERRED EMBODIMENT

An embodiment of the present invention will be explained below with reference to the accompanying drawings.

Figure 1:
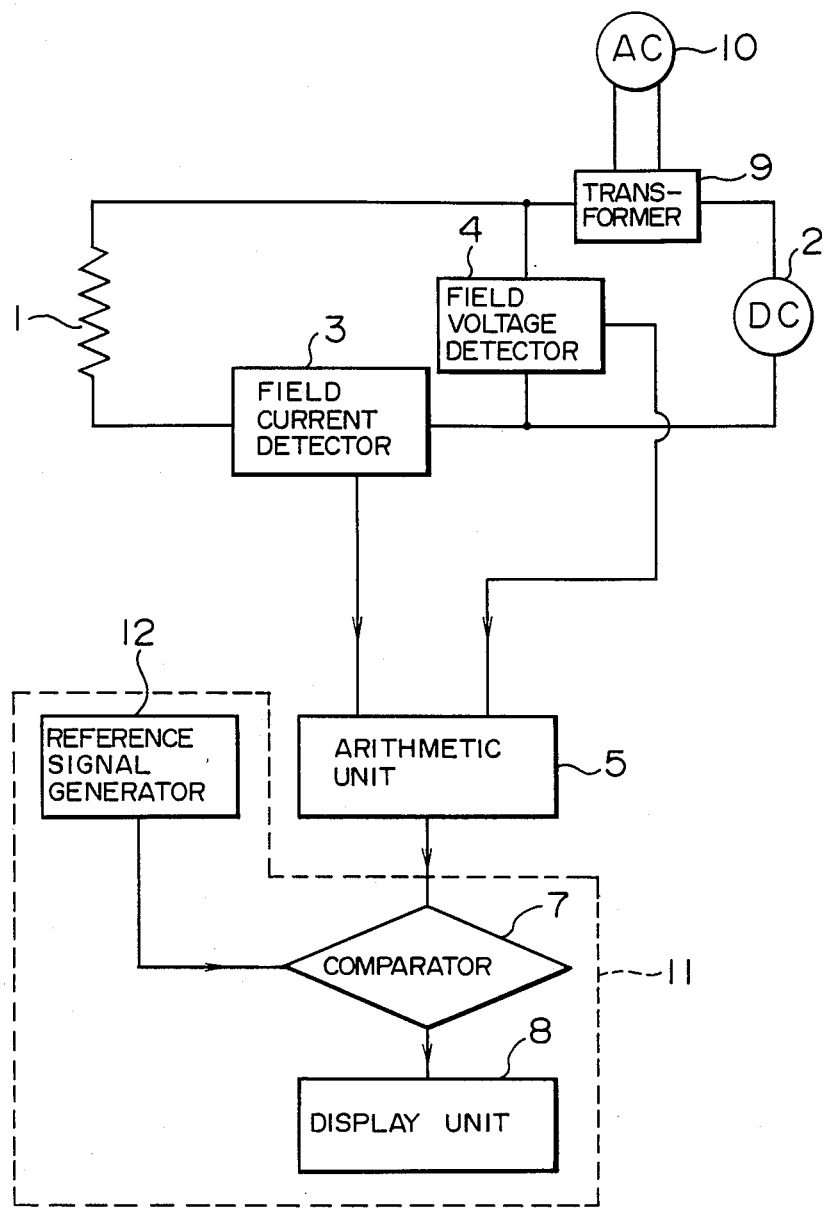
FIG. 1 is a block diagram showing a configuration of a rotor winding fault diagnosis system according to an embodiment of the present invention.

FIG. 1 is a block diagram for explaining the operating principle of a fault diagnosis system for rotor winding of rotary electric machines, in which a rotor winding 1 of field winding type is supplied with a DC voltage by excitation means 2 on the one and with an AC voltage from a power supply 10 through a transformer (DC-AC superposing means) 9 on the other. This excitation circuit includes a field voltage detector 4 for detecting the AC portion of the voltage of the rotor winding 1 and a field current detector 3 for detecting the AC portion flowing the rotor winding 1, that is, a super portion. The field voltage $V_{AC}$ detected at one field voltage detector 4 and the field current $I_{AC}$ detected at the field current detector 3 are applied to an arithmetic unit 5, whereby the impedance Z of the rotor winding 1 is calculated from the field voltage $V_{AC}$ and the field current $I_{AC}$. The impedance Z thus calculated is applied to a fault decision means 11 for deciding a fault of the rotor winding 1. The fault decision means 1 includes a comparator 7 for comparing the impedance Z calculated with a reference impedance $Z_O$ of the rotor winding 1 produced from a reference signal generator 12, and a display unit 8 for displaying a fault, if any, or an alarm unit for sounding an alarm.

In this manner, the excitation circuit is supplied with the DC voltage $V_{DC}$ and the current $I_{DC}$ from the excitation means 2, together with the AC voltage $V_{AC}$ and AC current $I_{AC}$ superposed by the power supply 10. The arithmetic unit 5 produces the impedance Z of the rotor winding 1 from the field voltage $V_{AC}$ detected at the field voltage detector 4 and the field current $I_{AC}$ detected at the field current detector 3 as shown below.

$$Z = V_{AC}/I_{AC} \qquad (6)$$

The impedance Z is compared with a reference impedance $Z_0$ from the reference signal generator 12 at the comparator 7, and if the absolute value $|Z_0 - Z|$ of the difference therebetween is larger than the reference value $\Delta Z$, an alarm signal is produced with a fault indicated on the display unit 8. Assume that the reference impedance $Z_0$ is 10 ohm and the reference value $\Delta Z$ is 3 ohm, for instance, the output of the arithmetic unit 5 is given as $Z = 10$ ohm if there is no fault in the rotor winding. Thus, $$|Z_0 - Z| < \Delta Z \qquad (7)$$

In this case, the comparator 7 produces no alarm signal.

Assume that an inter-layer shorting has occurred in the rotor winding 1 and the 2-ohm portion of the field winding 1 has become ineffective. In equation (4), $Z_l = 2$ ohm, and $Z = 10 - 2 = 8$ ohm. In this case, if the inter-layer shorting of the rotor winding 1 were diagnosed by a winding resistance as in the conventional way, $$|Z_0 - Z| < \Delta Z \qquad (8)$$

and in spite of an inter-layer shorting that has occurred, the comparator 7 would not issue any alarm signal. According to the embodiment under consideration, by contrast, the use of the AC power supply permits a current to flow offsetting the magnetic flux[s generated in a sound number of turns of winding by the electromagnetic induction, which in turn reduces the impedance $\Delta Z_2$. If $Z_2 = 3$ ohm, for instance, the impedance Z of the rotor winding 1 is given as $Z = 10 - 2 - 3 = 5$ ohm from equation (5), and thus, $$|Z_0 - Z| > \Delta Z \qquad (9)$$

As a result, the comparator 7 issues an alarm signal with a fault indicated on the display unit 8.

If a disconnection causes the impedance Z of the rotor winding 1 to be $\infty \Omega$, on the other hand, $$|Z_0 - Z| > \Delta Z$$

In similar manner, the comparator 7 produces an alarm signal and a fault is indicated on the display unit 8.

The value $\Delta Z$ should be set with a certain margin taking a faulty operation due to noises into consideration.

In this way, the detection accuracy of the interlayer shorting of the rotor winding 1 is improved, and the rotor winding can be diagnosed without affecting the DC excitation current $I_{DC}$ of the excitation circuit. The diagnosis of a fault is thus possible even while the rotary electric machine is running.

Figure 2:
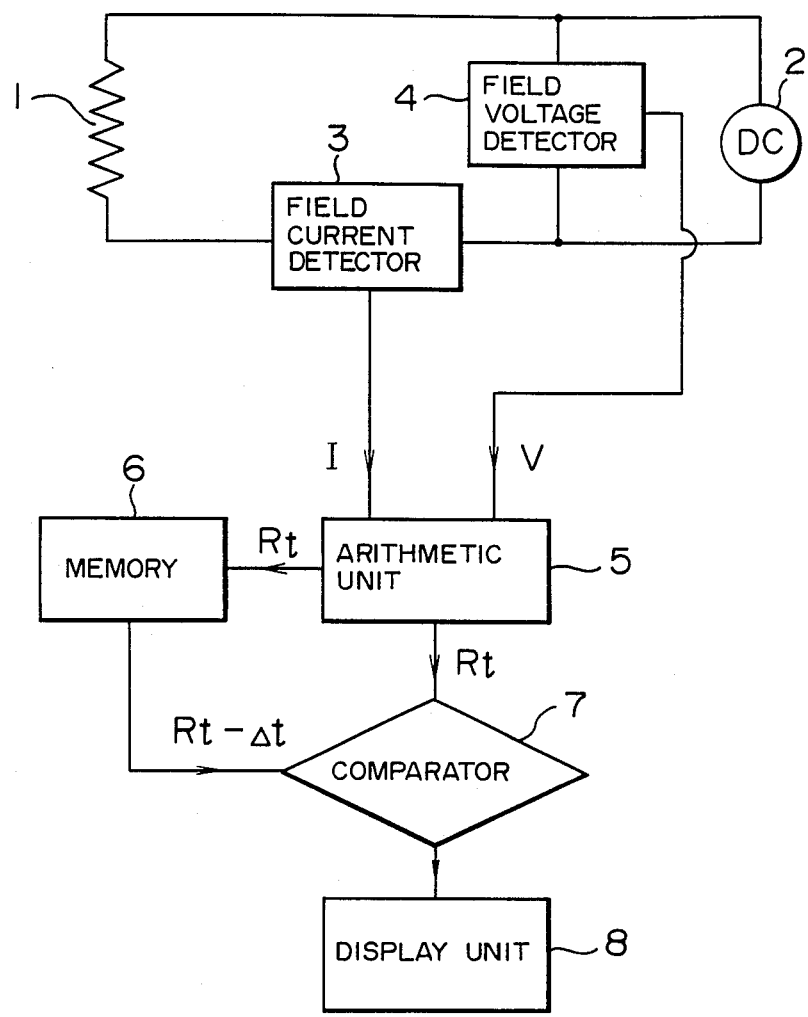
FIG. 2 is a block diagram showing a configuration of a rotor winding fault diagnosis system.

The fault decision means 11 is not limited to the configuration shown in the drawings. For instance, the output of the arithmetic unit 5 may be displayed on the display unit 8 and used for decision. Also, the reference impedance $Z_0$, which may be set in advance, may alternatively be produced in such a manner that as shown in FIG. 2, the impedance at a given time point calculated by the arithmetic unit 5 is stored in a memory and an impedance stored a predetermined time before the given time is produced as a reference impedance $Z_0$ from the reference signal generator 12.

Further, the AC voltage to be supposed is preferably small so as not to adversely affect the DC excitation, or 10% or less of the excitation voltage.

It will thus be understood from the foregoing description that according to the present invention, an AC power supply means is included in the excitation circuit and the AC portion of the voltage of the rotor winding and the AC portion of the current thereof are used to calculate the impedance of the rotor winding and thus to decide whether there is a fault of the rotor winding on the basis of the impedance thus calculated, to that a highly accurate fault detection is possible by utilizing the electromagnetic induction even while the rotary electric machine is in operation.

We claim:

1. A fault diagnosis system for a rotor winding of a rotary electric machine, comprising a rotor winding of rotary field type, DC excitation means for exciting the rotor winding, a power supply for superposing an AC voltage on the DC voltage of the excitation means, a field voltage detector for detecting the AC portion of the voltage of the rotor winding, a field current detector for detecting the AC portion of the current flowing in the rotor winding, an arithmetic unit for calculating the impedance of the rotor winding from the current and voltage detected by the field current detector and the field voltage detector respectively, and fault decision means for deciding a fault of the rotor winding from the impedance calculated by the arithmetic unit.

2. A fault diagnosis system for a rotor winding of a rotary electric machine, comprising a field winding, DC excitation means for exciting the field winding, an AC power supply for superposing an AC voltage of the DC voltage of the DC excitation means, a field voltage detector for detecting the voltage value of the AC portion of the rotor winding, a field current detector for detecting the current value of the AC portion of the rotor winding, an arithmetic unit for calculating the impedance of the field winding from the values detected by the field current detector and the field voltage detector, and a comparator for comparing the impedance calculated by the arithmetic unit with a reference impedance prepared in advance, wherein the magnitude of the difference of the impedances produced by the comparator is used to decide a fault of the field winding.

3. A fault diagnosis system according to claim 2, wherein said reference impedance takes a value calculated by the arithmetic unit a predetermined period of time in advance.

4. A fault diagnosis system for a rotor winding of a rotary electric machine, comprising a rotor winding of rotary field type, DC excitation means for exciting the rotor winding, a power supply for superposing an AC voltage on the DC voltage of the excitation means, a field voltage detector for detecting thr AC portion of the voltage of the rotor winding, and a field current detector for detecting the AC portion of the current flowing in the rotor winding, means for calculating the impedance of the rotor winding from the voltage value of the field voltage detector and the current value of the field current detector, and comparator means for comparing the impedance thus calculated with a reference impedance, so that the magnitude of the difference between said impedance and said reference impedance is used to decide a fault of the rotor winding.

5. A fault diagnosis system for a rotor winding of a rotary electric machine, comprising a rotor winding of rotary field type, DC excitation means for exciting the rotor winding, a power supply for superposing an AC voltage on the DC voltage of the excitation means, a field voltage detector for detecting the AC portion of the voltage of the rotor winding, a field current detector for detecting the AC portion of the current flowing in the rotor winding, an arithmetic unit for calculating the impedance of the rotor winding from the current and voltage detected by the field current detector and the field voltage detector respectively, and fault decision means for deciding a fault of the rotor winding from the impedance calculated by the arithmetic unit, wherein said fault decision means includes a reference signal generator for producing the reference impedance and a comparator for comparing the impedance calculated by the arithmetic unit the reference impedance produced from the reference signal generator and an alarm for producing an alarm signal when the difference between the impedance and the reference impedance exceeds a predetermined value.

6. A fault diagnosis system for a rotor winding of a rotary electric machine, comprising a rotor winding of rotary field type, a DC excitation circuit connected to the rotor winding for exciting the same, DC-AC superposing means for superposing an alternating current on the direct current of the DC excitation circuit, an AC power supply circuit for supplying an alternating current to the DC-AC superposing means associated with said DC excitation circuit, a field voltage detector for detecting the superposed AC portion of the voltage produced from the DC excitation circuit, a field current associated with said DC excitation circuit for detecting the superposed AC portion of the current of the DC excitation circuit, an arithmetic unit for calculating the impedance of the rotor winding from the values detected by the field current detector and the field voltage detector, a comparator for comparing the impedance calculated by the arithmetic unit with a predetermined reference impedance, and alarm means for producing a predetermined alarm signal when the difference between the impedance and the reference impedance produced from the comparator exceeds a predetermined value.

* * * * *